United States Patent
Enomoto et al.

(10) Patent No.: US 11,545,944 B2
(45) Date of Patent: Jan. 3, 2023

(54) POWER AMPLIFIER CIRCUIT

(71) Applicant: Murata Manufacturing Co., Ltd., Kyoto (JP)

(72) Inventors: Jun Enomoto, Kyoto (JP); Kazuo Watanabe, Kyoto (JP); Satoshi Tanaka, Kyoto (JP); Yusuke Tanaka, Kyoto (JP); Makoto Ito, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 167 days.

(21) Appl. No.: 17/151,922

(22) Filed: Jan. 19, 2021

(65) Prior Publication Data

US 2021/0226595 A1 Jul. 22, 2021

(30) Foreign Application Priority Data

Jan. 21, 2020 (JP) .............................. JP2020-007684

(51) Int. Cl.
| | |
|---|---|
| H03F 1/22 | (2006.01) |
| H03F 3/24 | (2006.01) |
| H03F 3/195 | (2006.01) |
| H03F 1/56 | (2006.01) |

(52) U.S. Cl.
CPC ............ *H03F 3/245* (2013.01); *H03F 1/565* (2013.01); *H03F 3/195* (2013.01); *H03F 2200/102* (2013.01); *H03F 2200/451* (2013.01)

(58) Field of Classification Search
CPC ............... H03F 1/22; H03F 1/30; H03F 3/191
USPC .......................................... 330/311, 302, 297
See application file for complete search history.

(56) References Cited

U.S. PATENT DOCUMENTS

| | | | |
|---|---|---|---|
| 6,137,367 A | 10/2000 | Ezzedine et al. | |
| 10,135,395 B2 * | 11/2018 | Tanaka | H03F 1/22 |
| 10,389,307 B2 | 8/2019 | Tanaka et al. | |
| 2012/0032743 A1 * | 2/2012 | Hsieh | H03G 1/0029 |
| | | | 330/285 |
| 2013/0194042 A1 * | 8/2013 | Sanduleanu | H03F 1/565 |
| | | | 330/302 |
| 2018/0152143 A1 | 5/2018 | Tanaka et al. | |
| 2018/0375474 A1 | 12/2018 | Namie | |

(Continued)

FOREIGN PATENT DOCUMENTS

| | | |
|---|---|---|
| CN | 106330109 A | 1/2017 |
| JP | 2018-085689 A | 5/2018 |
| JP | 2018-195954 A | 12/2018 |

*Primary Examiner* — Henry Choe
(74) *Attorney, Agent, or Firm* — Pearne & Gordon LLP

(57) ABSTRACT

A power amplifier circuit includes a power amplifier including a first transistor having a first terminal connected to a reference potential, a second terminal to which a first current and a radio-frequency signal are input, and a third terminal connected to a first power supply potential via a first inductor; a capacitor connected to the third terminal of the first transistor; a second transistor including a first terminal connected to the capacitor and the reference potential via a second inductor, a second terminal to which a second current is input and is connected to the reference potential, and a third terminal connected to the first power supply potential via a third inductor and outputs signal; and an adjustment circuit that outputs a third current corresponding to the first power supply potential or a second power supply potential to the second terminal of the second transistor.

7 Claims, 10 Drawing Sheets

(56) References Cited

U.S. PATENT DOCUMENTS

2020/0313626 A1\* 10/2020 Ding .................... H03F 1/0266
2020/0382080 A1\* 12/2020 Seshita ................ H03G 3/3036

\* cited by examiner

POWER AMPLIFIER CIRCUIT

CROSS REFERENCE TO RELATED APPLICATION

This application claims priority from Japanese Patent Application No. 2020-007684 filed on Jan. 21, 2020. The content of this application is incorporated herein by reference in its entirety.

BACKGROUND

The present disclosure relates to a power amplifier circuit. Japanese Unexamined Patent Application Publication No. 2018-85689 describes a power amplifier circuit in which the collector of a first transistor and the emitter of a second transistor are connected via a capacitor, a radio-frequency (RF) input signal is input to the base of the first transistor, and an RF output signal is output from the collector of the second transistor. The power amplifier circuit described in Japanese Unexamined Patent Application Publication No. 2018-85689 can increase output power without necessarily increasing a power supply potential.

It is desirable that a power amplifier circuit amplify an RF signal with low distortion. Accordingly, it is desirable that a power amplifier circuit have linearity, that is, constant gain.

In addition, an envelope tracking power supply circuit has been become available that applies a power supply potential corresponding to the envelope of an RF signal to the power amplifier circuit to reduce power consumption. The gain of the power amplifier circuit is set so that the maximum efficiency can be obtained when the power supply potential is high (when the amplitude of the RF signal is relatively large). It is therefore desirable that the gain of the power amplifier circuit be constant as a set gain even if the power supply potential changes. However, the power amplifier circuit may have a characteristic in which the gain is larger than the set gain described above when the power supply potential is low (when the amplitude of the RF signal is relatively small). If the gains are different when the amplitude of the RF signal is relatively small and when the amplitude of the RF signal is relatively large, the power amplifier does not operate linearly. It is therefore suitable to reduce the gain when the power supply potential is low to make the gains equal when the power supply potential is high and when the power supply potential is low.

Japanese Unexamined Patent Application Publication No. 2018-195954 describes a power amplifier circuit in which a variable power supply potential is supplied from an envelope tracking power supply circuit and a bias current flowing through the base of a transistor decreases as the variable power supply potential decreases. In the power amplifier circuit described in Japanese Unexamined Patent Application Publication No. 2018-195954, the gain of the transistor decreases as the variable power supply potential decreases, and a gain dispersion characteristic can be improved. Gain dispersion refers to a difference in gain in accordance with a change in the power supply potential to be supplied to the transistor. In the power amplifier circuit described in Japanese Unexamined Patent Application Publication No. 2018-195954, the increase in gain when the power supply potential is low can be suppressed, and the gains can be made equal when the power supply potential is low and when the power supply potential is high. In the power amplifier circuit described in Japanese Unexamined Patent Application Publication No. 2018-195954, therefore, it is possible to reduce the change in gain caused by a change in power supply voltage with a change in instantaneous output level and to reduce the distortion of an RF signal due to the linear operation of time-series amplification.

Also, in the power amplifier circuit described in Japanese Unexamined Patent Application Publication No. 2018-85689 of the type in which the collector of the first transistor and the emitter of the second transistor are connected via a capacitor, it is desirable to reduce the distortion of an RF signal.

BRIEF SUMMARY

Accordingly, the present disclosure reduces the distortion of an RF signal.

According to embodiments of the present disclosure, a power amplifier circuit includes a first bias circuit that outputs a first current; a second bias circuit that outputs a second current; a power amplifier including a first transistor having a first terminal electrically connected to a reference potential, a second terminal to which the first current is to be input via a first resistor and to which a radio-frequency signal is to be input via a first direct-current cut capacitor, and a third terminal electrically connected to a first power supply potential that changes in accordance with an envelope of the radio-frequency signal via a first inductor, a capacitor having a first end electrically connected to the third terminal of the first transistor, and a second end, and a second transistor having a first terminal electrically connected to the second end of the capacitor and electrically connected to the reference potential via a second inductor, a second terminal to which the second current is to be input via a second resistor and which is electrically connected to the reference potential via a second direct-current cut capacitor, and a third terminal electrically connected to the first power supply potential via a third inductor, the second transistor being configured to output from the third terminal thereof a radio-frequency output signal obtained by amplifying the radio-frequency signal; and an adjustment circuit that outputs a third current corresponding to the first power supply potential or a second power supply potential that changes in accordance with the envelope to the second terminal of the second transistor via the second resistor.

According to embodiments of the present disclosure, it may be possible to reduce the distortion of an RF signal.

Other features, elements, characteristics and advantages of the present disclosure will become more apparent from the following detailed description of embodiments of the present disclosure with reference to the attached drawings.

DETAILED DESCRIPTION

The following describes power amplifier circuits according to embodiments of the present disclosure in detail with reference to the drawings. It should be noted that the present disclosure is not limited by the embodiments. It is to be understood that the embodiments are illustrative and components presented in different embodiments may be partially replaced or combined. Features common to a first embodiment will not be described in a second embodiment and the subsequent embodiments, and only differences will be described. In particular, similar operations and effects achieved with similar configurations will not be described again in the individual embodiments.

First Embodiment

Overall Configuration

Figure 1:
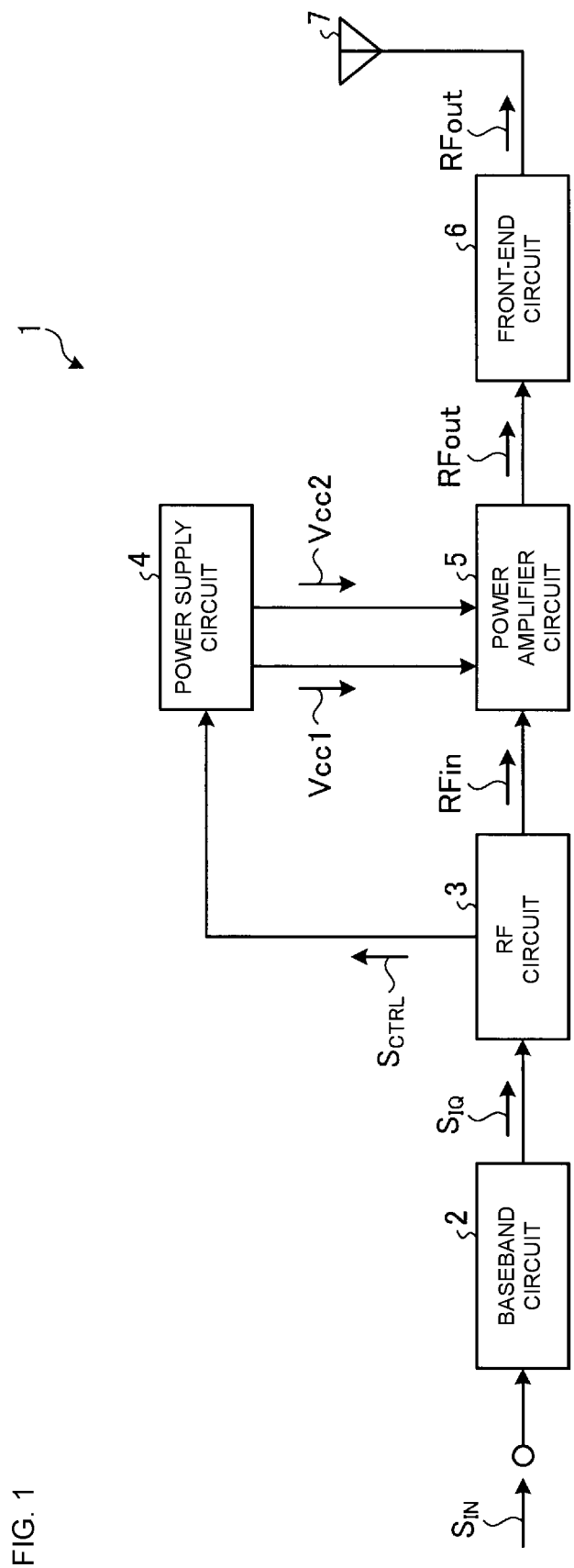
FIG. 1 illustrates the configuration of a transmitting circuit including a power amplifier circuit according to a first embodiment.

FIG. 1 illustrates the configuration of a transmitting circuit 1 including a power amplifier circuit according to a first embodiment. The transmitting circuit 1 is included in, for example, a wireless communication terminal device, such as a mobile phone device and is used to transmit various signals, such as audio and data signals to a base station. The wireless communication terminal device also includes a receiving unit for receiving a signal from the base station, although not described herein.

As illustrated in FIG. 1, the transmitting circuit 1 includes a baseband circuit 2, a radio frequency (RF) circuit 3, a power supply circuit 4, a power amplifier circuit 5, a front-end circuit 6, and an antenna 7.

The baseband circuit 2 modulates an input signal $S_{IN}$, such as an audio or data signal in accordance with a modulation method, such as High Speed Uplink Packet Access (HSUPA) or Long Term Evolution (LTE) and outputs a modulated signal $S_{IQ}$. The modulated signal $S_{IQ}$ is an IQ signal (I signal and Q signal) representing the amplitude and the phase in an IQ plane.

The RF circuit 3 outputs an RF input signal RFin on the basis of the modulated signal $S_{IQ}$ output from the baseband circuit 2. Further, the RF circuit 3 detects the amplitude level of the modulated signal $S_{IQ}$ on the basis of the modulated signal $S_{IQ}$. Further, the RF circuit 3 outputs a control signal $S_{CTRL}$ to the power supply circuit 4 to control the power supply circuit 4 so that power supply potentials Vcc1 and Vcc2 to be supplied to the power amplifier circuit 5 have levels corresponding to the amplitude level of the RF input signal RFin. Specifically, the RF circuit 3 outputs the control signal $S_{CTRL}$ to the power supply circuit 4 to control the power supply circuit 4 so that the power supply potentials Vcc1 and Vcc2 have levels corresponding to the envelope of the RF input signal RFin. That is, the RF circuit 3 outputs to the power supply circuit 4 the control signal $S_{CTRL}$ for performing envelope tracking.

The RF circuit 3 may not directly convert the modulated signal $S_{IQ}$ into the RF input signal RFin, but may convert the modulated signal $S_{IQ}$ into an intermediate frequency (IF) signal and generate the RF input signal RFin from the IF signal.

The power supply circuit 4 is an envelope tracking power supply circuit that generates the power supply potentials Vcc1 and Vcc2 having levels corresponding to the control signal $S_{CTRL}$ output from the RF circuit 3, that is, levels corresponding to the envelope of the RF input signal RFin, and outputs the power supply potentials Vcc1 and Vcc2 to the power amplifier circuit 5. The power supply circuit 4 may be constituted by, for example, a direct current-direct current (DC-DC) converter that generates the power supply potentials Vcc1 and Vcc2 having levels corresponding to the control signal $S_{CTRL}$ from the input potential.

The power supply potential Vcc1 and the power supply potential Vcc2 may be the same potential or may be different potentials. It is desirable that each of the power supply potentials Vcc1 and Vcc2 be a potential that changes in accordance with the envelope of the RF input signal RFin.

The power supply potential Vcc2 corresponds to a "first power supply potential" of the present disclosure. The power supply potential Vcc1 corresponds to a "second power supply potential" of the present disclosure.

The power amplifier circuit 5 amplifies the power of the RF input signal RFin output from the RF circuit 3 to a level required for transmission to a base station. The power amplifier circuit 5 outputs an amplified RF output signal RFout to the front-end circuit 6.

The front-end circuit 6 performs processing, such as filtering of the RF output signal RFout and switching with a reception signal received from the base station. The RF output signal RFout output from the front-end circuit 6 is transmitted to the base station via the antenna 7.

Circuit Configuration of Power Amplifier Circuit

Figure 2:
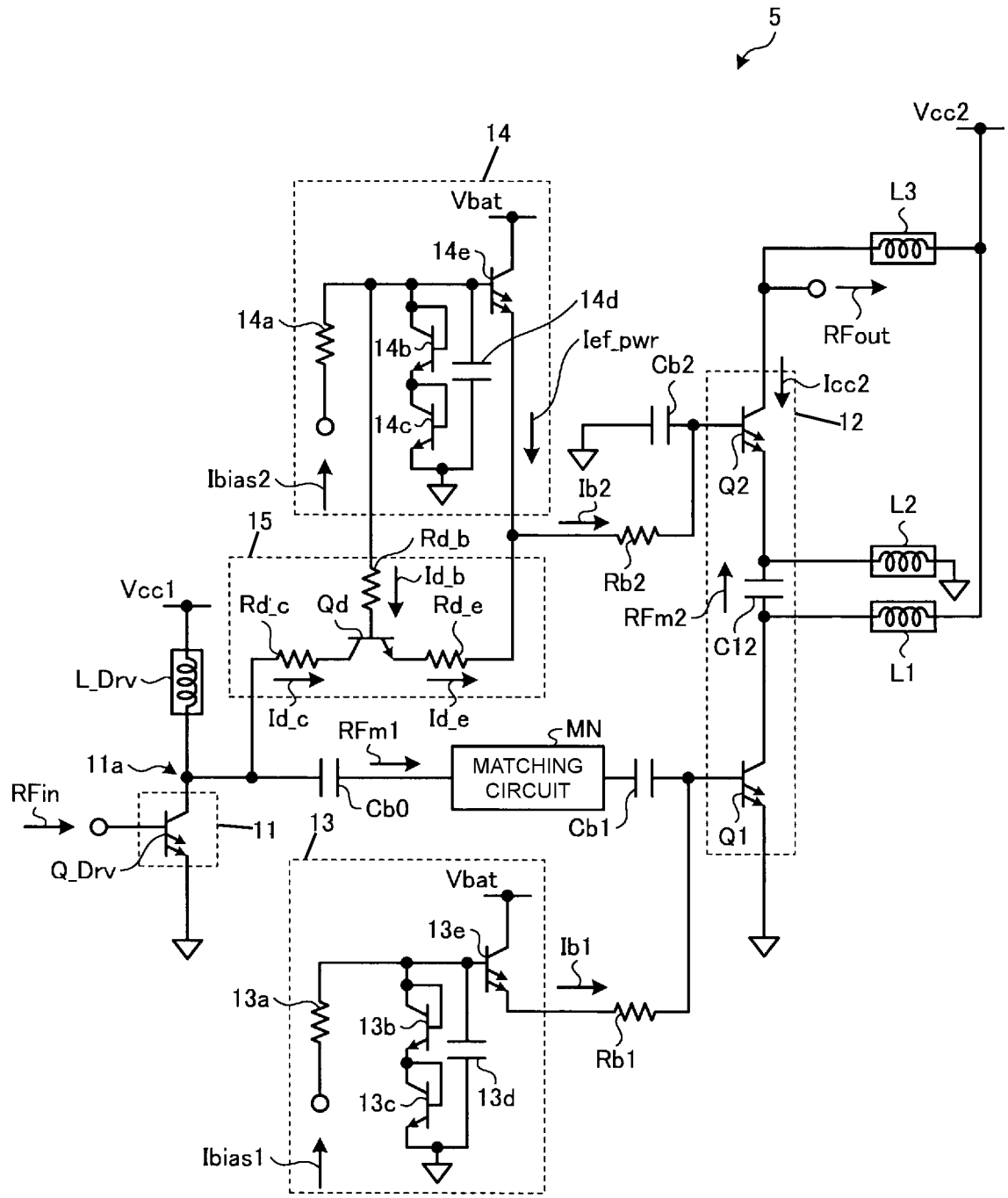
FIG. 2 illustrates a circuit configuration of the power amplifier circuit according to the first embodiment.

FIG. 2 illustrates a circuit configuration of the power amplifier circuit 5 according to the first embodiment. The power amplifier circuit 5 is included in, for example, a mobile communication device, such as a mobile phone device and is configured to amplify the RF input signal RFin having a radio frequency and output the RF output signal RFout. Each of the RF input signal RFin and the RF output signal RFout has a frequency in the range of about several hundreds of megahertz (MHz) to several tens of gigahertz (GHz), for example but not limitation.

The power amplifier circuit 5 includes power amplifiers 11 and 12, bias circuits 13 and 14, and an adjustment circuit 15. Further, the power amplifier circuit 5 includes inductors L_Drv, L1, L2, and L3, capacitors Cb0, Cb1, and Cb2, resistors Rb1 and Rb2, and a matching circuit MN.

The power amplifier 12 corresponds to a "power amplifier" of the present disclosure. The power amplifier 11 corresponds to a "second power amplifier" of the present disclosure. The bias circuit 13 corresponds to a "first bias circuit" of the present disclosure. The bias circuit 14 corresponds to a "second bias circuit" of the present disclosure. The inductor L1 corresponds to a "first inductor" of the present disclosure. The inductor L2 corresponds to a "second inductor" of the present disclosure. The inductor L3 corresponds to a "third inductor" of the present disclosure. The inductor L_Drv corresponds to a "fourth inductor" of the present disclosure. The resistor Rb1 corresponds to a "first resistor" of the present disclosure. The resistor Rb2 corresponds to a "second resistor" of the present disclosure. The capacitor Cb1 corresponds to a "first direct-current cut capacitor" of the present disclosure. The capacitor Cb2 corresponds to a "second direct-current cut capacitor" of the present disclosure. The adjustment circuit 15 corresponds to an "adjustment circuit" of the present disclosure.

The power amplifier circuit 5 may be implemented as a hybrid integrated circuit (IC) (or module) configured such that a plurality of components (such as semiconductor ICs) are mounted on a single substrate, although the present disclosure is not limited thereto.

Further, the power amplifier circuit 5 includes two stages of power amplifiers, namely, the power amplifier 11 and the power amplifier 12, although the present disclosure is not limited thereto. The power amplifier circuit 5 may include one stage of power amplifier or three or more stages of power amplifiers. For example, the power amplifier circuit 5 may further include one or more power amplifiers between the power amplifier 11 and the power amplifier 12. For example, the power amplifier circuit 5 may only include the power amplifier 12, and may not include the power amplifier 11.

The power amplifier 11 may be referred to as an initial-stage or drive-stage power amplifier. The power amplifier 12 may be referred to as a final-stage or power-stage power amplifier.

Focusing on the power amplifier 11, the power amplifier 11 includes a transistor Q_Drv. The transistor Q_Drv corresponds to a "fourth transistor" of the present disclosure.

In the present disclosure, each transistor is a bipolar transistor, although the present disclosure is not limited thereto. Non-limiting examples of the bipolar transistor include a heterojunction bipolar transistor (HBT). Each transistor may be, for example, a field effect transistor (FET). Each transistor may be a multi-finger transistor having a plurality of unit transistors (also referred to as fingers) electrically connected in parallel to each other. The term "unit transistor" refers to a minimum element of a transistor.

The emitter or source of each transistor corresponds to a "first terminal" of the present disclosure. The base or gate of each transistor corresponds to a "second terminal" of the present disclosure. The collector or drain of each transistor corresponds to a "third terminal" of the present disclosure.

The emitter of the transistor Q_Drv is electrically connected to a reference potential. The reference potential is ground potential, for example but not limitation.

The collector of the transistor Q_Drv is electrically connected to a first end of the inductor L_Drv. A second end of the inductor L_Drv is electrically connected to the power supply potential Vcc1. The inductor L_Drv is a choke inductor that allows direct current (DC) to pass while blocking alternating current (AC) to prevent the coupling of the RF input signal RFin to the power supply circuit 4 (see FIG. 1). The inductor L_Drv supplies power of the power supply potential Vcc1 to the collector of the transistor Q_Drv. A collector current flows through the collector of the transistor Q_Drv from the power supply potential Vcc1 via the inductor L_Drv.

The inductor L_Drv has sufficiently high impedance for the frequency range of the RF input signal RFin. That is, the impedance of the inductor L_Drv is negligible in consideration of the frequency range of the RF input signal RFin.

The RF input signal RFin is input to the base of the transistor Q_Drv. The transistor Q_Drv outputs an RF signal RFm1 obtained by amplifying the power of the RF input signal RFin from the collector thereof.

Focusing on the power amplifier 12, the power amplifier 12 includes transistors Q1 and Q2 and a capacitor C12.

The transistor Q1 corresponds to a "first transistor" of the present disclosure. The transistor Q2 corresponds to a "second transistor" of the present disclosure. The capacitor C12 corresponds to a "capacitor" of the present disclosure.

The transistor Q1 and the transistor Q2 may or may not have the same size (the number of fingers).

The capacitor C12 is electrically connected between the collector of the transistor Q1 and the emitter of the transistor Q2. The capacitor C12 is a DC cut capacitor that blocks DC while allowing AC to pass. That is, the capacitor C12 isolates (separates) the transistor Q1 and the transistor Q2 from each other for DC and couples (connects) the transistor Q1 and the transistor Q2 to each other for AC.

The transistor Q1 amplifies the RF signal RFm1 and outputs an amplified RF signal RFm2 to the capacitor C12. The capacitor C12 allows the RF signal RFm2 to pass. The transistor Q2 amplifies the RF signal RFm2 passing through the capacitor C12 and outputs an amplified RF output signal RFout.

Focusing on the transistor Q1, the emitter of the transistor Q1 is electrically connected to the reference potential. The base of the transistor Q1 is electrically connected to the collector of the transistor Q_Drv via the capacitor Cb0, the matching circuit MN, and the capacitor Cb1. The RF signal RFm1 is input to the base of the transistor Q1 via the capacitor Cb0, the matching circuit MN, and the capacitor Cb1.

Further, the base of the transistor Q1 is electrically connected to a first end of the resistor Rb1. A second end of the resistor Rb1 is electrically connected to the bias circuit 13. A bias current Ib1 is input to the second end of the resistor Rb1 from the bias circuit 13.

The bias current Ib1 corresponds to a "first current" of the present disclosure.

Focusing on the bias circuit 13, the bias circuit 13 includes a resistor 13a, transistors 13b, 13c, and 13e, and a capacitor 13d.

A constant bias current Ibias1 is input to a first end of the resistor 13a. A second end of the resistor 13a is electrically connected to the collector and base of the transistor 13b.

The collector and base of the transistor 13b are electrically connected. That is, the transistor 13b is diode-connected. The emitter of the transistor 13b is electrically connected to the collector and base of the transistor 13c.

The collector and base of the transistor 13c are electrically connected. That is, the transistor 13c is diode-connected. The emitter of the transistor 13c is electrically connected to the reference potential.

A first end of the capacitor 13d is electrically connected to the collector and base of the transistor 13b. A second end of the capacitor 13d is electrically connected to the reference potential. The capacitor 13d stabilizes the voltage across the transistors 13b and 13c, that is, a voltage across two diodes.

The collector of the transistor 13e is electrically connected to a constant power supply potential Vbat. The base of the transistor 13e is electrically connected to the first end of the capacitor 13d. A constant bias current is input to the base of the transistor 13e. The emitter of the transistor 13e is electrically connected to the second end of the resistor Rb1. The first end of the resistor Rb1 is electrically connected to the base of the transistor Q1. That is, the transistor 13e is emitter-follower connected. The transistor 13e outputs the constant bias current Ib1 to the base of the transistor Q1 via the resistor Rb1.

Focusing again on the transistor Q1, the collector of the transistor Q1 is electrically connected to a first end of the inductor L1. A second end of the inductor L1 is electrically connected to the power supply potential Vcc2. The inductor L1 is a choke inductor that allows DC to pass while blocking AC to prevent the coupling of the RF signal RFm1 to the power supply circuit 4 (see FIG. 1). The inductor L1 supplies power of the power supply potential Vcc2 to the collector of the transistor Q1. A collector current flows through the collector of the transistor Q1 from the power supply potential Vcc2 via the inductor L1.

The inductor L has sufficiently high impedance for the frequency range of the RF signal RFm1. That is, the impedance of the inductor L1 is negligible in consideration of frequency range of the RF signal RFm1.

The collector of the transistor Q1 is electrically connected to a first end of the capacitor C12.

In summary, the transistor Q1 is as follows. The power supply potential Vcc2 is supplied to the collector of the transistor Q1 via the inductor L1, and the emitter of the transistor Q1 is grounded. Further, the bias current Ib1 is supplied to the base of the transistor Q1 from the bias circuit 13, and the RF signal RFm1 is input to the base of the transistor Q1. Accordingly, the transistor Q1 amplifies the RF signal RFm1 and outputs the amplified RF signal RFm2 to the transistor Q2 via the capacitor C12.

Focusing on the transistor Q2, the emitter of the transistor Q2 is electrically connected to a second end of the capacitor C12.

Further, the emitter of the transistor Q2 is electrically connected to a first end of the inductor L2. A second end of the inductor L2 is electrically connected to the reference potential. The inductor L2 is a choke inductor that allows DC to pass while blocking AC.

The base of the transistor Q2 is electrically connected to a first end of the capacitor Cb2. A second end of the capacitor Cb2 is electrically connected to the reference potential. The capacitor Cb2 blocks DC while allowing AC to pass.

Further, the base of the transistor Q2 is electrically connected to a first end of the resistor Rb2. A second end of the resistor Rb2 is electrically connected to the bias circuit 14 and the adjustment circuit 15. A bias current Ib2 is input to the second end of the resistor Rb2 from the bias circuit 14 and the adjustment circuit 15.

Focusing on the bias circuit 14, the bias circuit 14 includes a resistor 14a, transistors 14b, 14c, and 14e, and a capacitor 14d.

The connection relationship among the resistor 14a, the transistors 14b, 14c, and 14e, and the capacitor 14d of the bias circuit 14 is similar to the connection relationship among the resistor 13a, the transistors 13b, 13c, and 13e, and the capacitor 13d of the bias circuit 13 and will not be described.

A constant bias current Ibias2 is input to a first end of the resistor 14a. The emitter of the transistor 14e is electrically connected to the second end of the resistor Rb2. The first end of the resistor Rb2 is electrically connected to the base of the transistor Q2. That is, the transistor 14e is emitter-follower connected. The transistor 14e outputs a current Ief_pwr, which is an emitter current, to the second end of the resistor Rb2.

The current Ief_pwr corresponds to a "second current" of the present disclosure.

Focusing on the adjustment circuit 15, the adjustment circuit 15 includes a transistor Qd and resistors Rd_b, Rd_c, and Rd_e. The resistors Rd_b, Rd_c, and Rd_e may be wiring resistors.

The resistor Rd_b corresponds to a "third resistor" of the present disclosure. The resistor Rd_c corresponds to a "fourth resistor" of the present disclosure.

The transistor Qd is a heterojunction bipolar transistor with a heterojunction between the emitter and base thereof, and the bandgap of the emitter is larger than the bandgap of the base.

A first end of the resistor Rd_b is electrically connected to the base of the transistor 14e and a first end of the capacitor 14d. A second end of the resistor Rd_b is electrically connected to the base of the transistor Qd.

A first end of the resistor Rd_c is electrically connected to a node 11a between the first end of the inductor L_Drv and the collector of the transistor Q_Drv. That is, the power supply potential Vcc1, which is an envelope-tracking power supply potential, is input to the first end of the resistor Rd_c. A second end of the resistor Rd_c is electrically connected to the collector of the transistor Qd.

A first end of the resistor Rd_e is electrically connected to the emitter of the transistor Qd. A second end of the resistor Rd_e is electrically connected to the second end of the resistor Rb2. The resistor Rd_e is optional. That is, the emitter of the transistor Qd may be electrically connected to the second end of the resistor Rb2.

The potential at the first end of the resistor Rd_b is equal to the potential (constant potential) of the capacitor 14d. The potential at the first end of the resistor Rd_c is equal to the power supply potential Vcc1, which is an envelope-tracking power supply potential. Accordingly, the operation of the transistor Qd changes in accordance with the power supply potential Vcc1.

The bias current Ib2 is the sum of the current Ief_pwr, which is the emitter current of the transistor 14e, and a current Id_e, which is the emitter current of the transistor Qd. That is, Ib2=Ief_pwr+Id_e. Accordingly, the current Ief_pwr and the current Id_e contribute to the adjustment of the bias point of the transistor Q2. The current Id_e is the sum of a current Id_b, which is the base current of the transistor Q2, and a current Id_c, which is the collector current of the transistor Q2. That is, Id_e=Id_b+Id_c.

The current Id_e corresponds to a "third current" of the present disclosure.

The adjustment circuit 15 outputs the current Id_e corresponding to the power supply potential Vcc1 to the base of the transistor Q2 via the resistors Rd_e and Rb2 to adjust the bias current Ib2. The operation of the adjustment circuit 15 will be described in detail below.

Focusing again on the transistor Q2, the collector of the transistor Q2 is electrically connected to a first end of the inductor L3. A second end of the inductor L3 is electrically connected to the power supply potential Vcc2. The inductor L3 is a choke inductor that allows DC to pass while blocking AC to prevent the coupling of the RF signal RFm2 to the power supply circuit 4 (see FIG. 1). The inductor L3 supplies power of the power supply potential Vcc2 to the collector of the transistor Q2. A collector current Icc2 flows through the collector of the transistor Q2 from the power supply potential Vcc2 via the inductor L3.

The inductor L3 has sufficiently high impedance for the frequency range of the RF signal RFm2. That is, the impedance of the inductor L3 is negligible in consideration of the frequency range of the RF signal RFm2.

In summary, the transistor Q2 is as follows. The power supply potential Vcc2 is supplied to the collector of the transistor Q2 via the inductor L3, and the emitter of the transistor Q2 is grounded via the inductor L2. Further, the RF signal RFm2 is input to the emitter of the transistor Q2 from the transistor Q1 via the capacitor C12. Further, the bias current Ib2 is supplied to the base of the transistor Q2 from the bias circuit 14 and the adjustment circuit 15. Accordingly, the transistor Q2 amplifies the RF signal RFm2 and outputs the amplified RF output signal RFout to the subsequent circuit (the front-end circuit 6 illustrated in FIG. 1).

Operation of Power-Stage Power Amplifier

The operation of the power-stage power amplifier 12 will be described. In the following description, for ease of understanding, the power supply potential Vcc2 is 3 volts (hereinafter sometimes referred to as "DC3V"), although the present disclosure is not limited thereto. Actually, the power supply potential Vcc2 changes in accordance with the envelope of the RF input signal RFin.

The first end of the capacitor C12 is electrically connected to the collector of the transistor Q1, and the second end of the capacitor C12 is electrically connected to the emitter of the transistor Q2. The capacitor C12 isolates the transistor Q1 and the transistor Q2 from each other for DC and couples the transistor Q1 and the transistor Q2 to each other for AC.

The first end of the inductor L2 is electrically connected to the emitter of the transistor Q2, and the second end of the inductor L2 is grounded. The inductor L2 has high impedance for high frequencies and thus does not affect the amplification of RF signals. That is, the inductor L2 connects the emitter of the transistor Q2 to ground for DC.

Focus is placed on the transistor Q1. The emitter of the transistor Q1 is grounded, and the power supply potential Vcc2 (here, DC3V) is supplied to the collector of the transistor Q1 via the inductor L1. Accordingly, the RF signal RFm2 has an amplitude of ±3 V for AC (hereinafter sometimes referred to as AC±3V). That is, the collector potential of the transistor Q1 varies in the range of 3 V±3 V, that is, in the range of 0 V to +6 V.

Focus is placed on the transistor Q2. Since the emitter of the transistor Q2 is grounded for DC, resulting in DC0V, and is coupled (connected) to the collector of the transistor Q1 for AC, resulting in AC±3V. Accordingly, the emitter potential of the transistor Q2 varies in the range of 0 V±3 V, that is, in the range of −3 V to +3 V.

The collector of the transistor Q2 has a potential of DC3V since the power supply potential Vcc2 is supplied for DC, and has a potential of AC±6V since the variable range of the emitter potential of the transistor Q2 is added for AC. Accordingly, the RF output signal RFout has an amplitude of AC±6V. That is, the collector potential of the transistor Q2 varies in the range of 3 V±6 V, that is, in the range of −3 V to +9 V.

That is, the collector of the transistor Q2 has a signal amplitude of 12 V (−3 V to +9 V), which is twice the signal amplitude of the collector of the transistor Q1, namely, 6 V (0 V to +6 V).

As described above, the power amplifier 12 has a cascode configuration in which the transistor Q1 and the transistor Q2 are connected via the capacitor C12. Accordingly, the power amplifier 12 can increase the amplitude of the RF output signal RFout (for example, 12 V from −3 V to +9 V) to about twice the amplitude (for example, 6 V from 0 V to +6 V) of an output signal of a power amplifier with a single configuration. That is, the power amplifier 12 can increase the amplitude of the RF output signal RFout without necessarily increasing the power supply potential using a booster circuit.

If the output power of a signal is denoted by P, the collector voltage is denoted by V, and the load impedance is denoted by R, a relationship of $P=V^2/R$ is satisfied. When the load impedance R is constant, doubling the collector voltage V approximately quadruples the output power P. Accordingly, the power amplifier 12 can increase the amplitude of the RF output signal RFout to increase the output power P without necessarily increasing the power supply potential, compared with a power amplifier with a single configuration.

When the output power P is constant, doubling the collector voltage V approximately quadruples the load impedance R. In general, as the load impedance R increases, an impedance conversion ratio that is a conversion ratio at which an impedance matching circuit (not illustrated) subsequent to the transistor Q2 performs impedance matching with a load circuit (the front-end circuit 6 illustrated FIG. 1) decreases. This decreases the transmission loss and return loss in the matching circuit and improves power-added efficiency (PAE). Also, in this embodiment, accordingly, the amplitude of the RF output signal RFout is increased, thereby increasing the load impedance R. As a result, the impedance conversion ratio of the matching circuit decreases. Accordingly, the power amplifier 12 reduces the loss of the RF output signal RFout in the matching circuit and improves power-added efficiency, compared with a power amplifier with a single configuration. As described above, the power amplifier 12 can also improve power-added efficiency.

Operation of Adjustment Circuit

The operation of the adjustment circuit 15 will be described with reference to FIGS. 3 to 8. FIGS. 3 to 8 illustrate circuit simulation results of the power amplifier circuit 5 according to the first embodiment.

Figure 3:
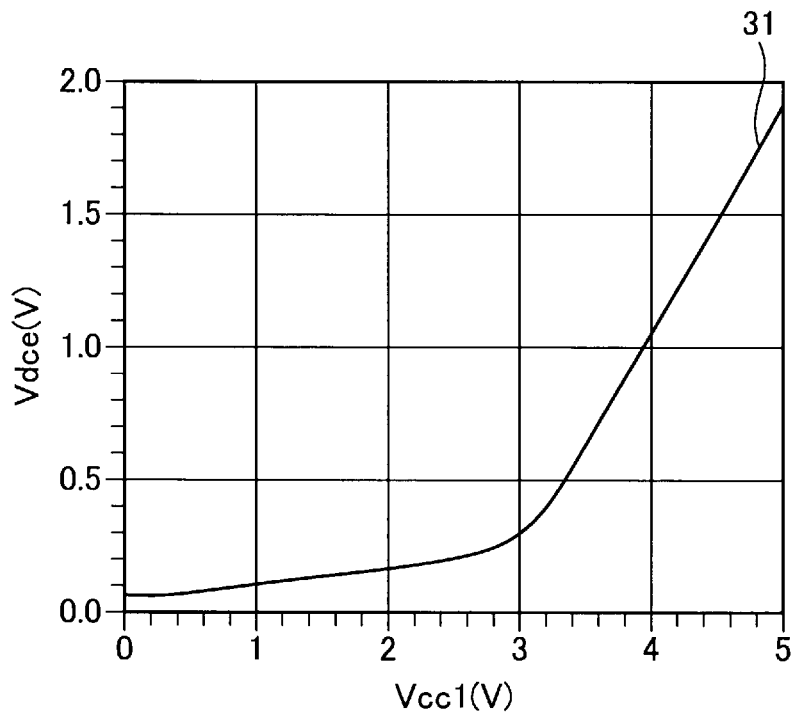
FIG. 3 illustrates circuit simulation results of the power amplifier circuit according to the first embodiment.

Specifically, FIG. 3 illustrates a waveform 31 indicating a relationship between the power supply potential Vcc1 and a voltage Vdce, which is the collector-emitter voltage of the transistor Qd. In FIG. 3, the horizontal axis represents the power supply potential Vcc1, and the vertical axis represents the voltage Vdce.

Figure 4:
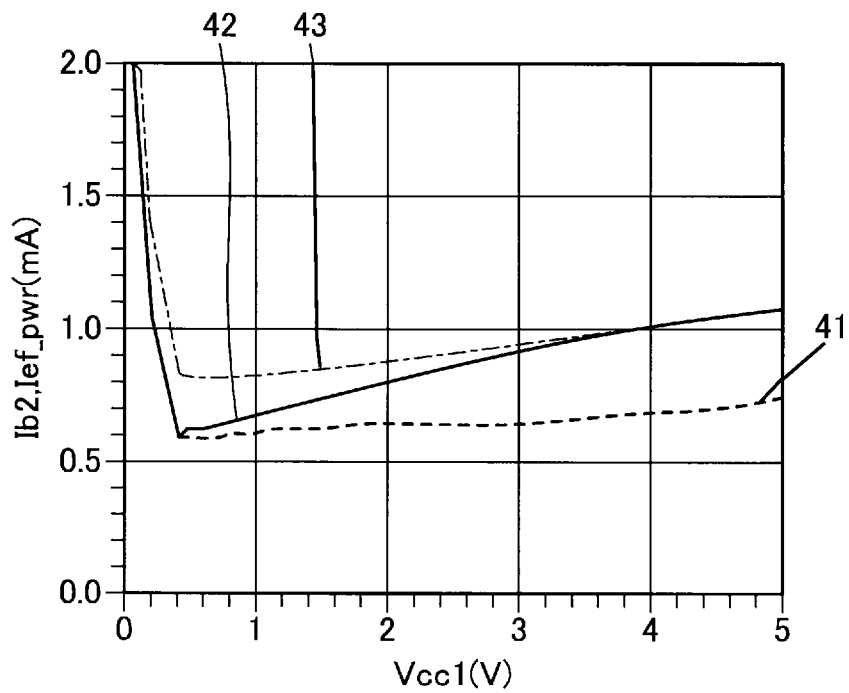
FIG. 4 illustrates circuit simulation results of the power amplifier circuit according to the first embodiment.

FIG. 4 illustrates relationships between the power supply potential Vcc1 and currents including the bias current Ib2 and the current Ief_pwr. In FIG. 4, the horizontal axis represents the power supply potential Vcc1, and the vertical axis represents the bias current Ib2 and the current Ief_pwr. A waveform 41 is a waveform indicating a relationship between the power supply potential Vcc1 and the current Ief_pwr. A waveform 42 is a waveform indicating a relationship between the power supply potential Vcc1 and the bias current Ib2. A waveform 43 is a waveform indicating a relationship between the power supply potential Vcc1 and the bias current Ib2 in a power amplifier circuit 100 of a comparative example described below.

Figure 5:
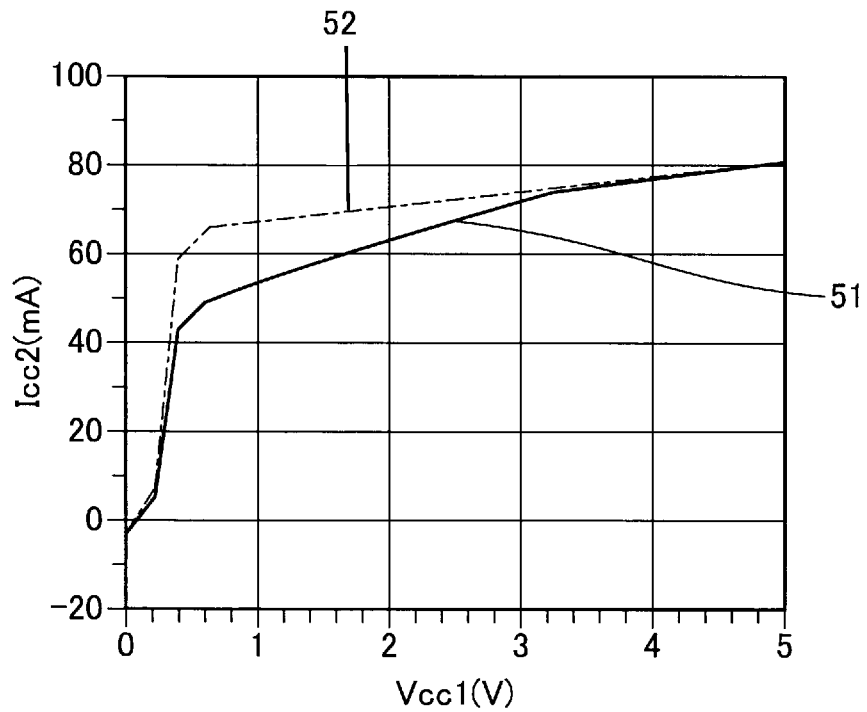
FIG. 5 illustrates circuit simulation results of the power amplifier circuit according to the first embodiment.

FIG. 5 illustrates relationships between the power supply potential Vcc1 and the collector current Icc2 of the transistor Q2. In FIG. 5, the horizontal axis represents the power supply potential Vcc1, and the vertical axis represents the collector current Icc2. A waveform 51 is a waveform indicating a relationship between the power supply potential Vcc1 and the collector current Icc2. A waveform 52 is a waveform indicating a relationship between the power supply potential Vcc1 and the collector current Icc2 in the power amplifier circuit 100 of the comparative example described below.

Figure 6:
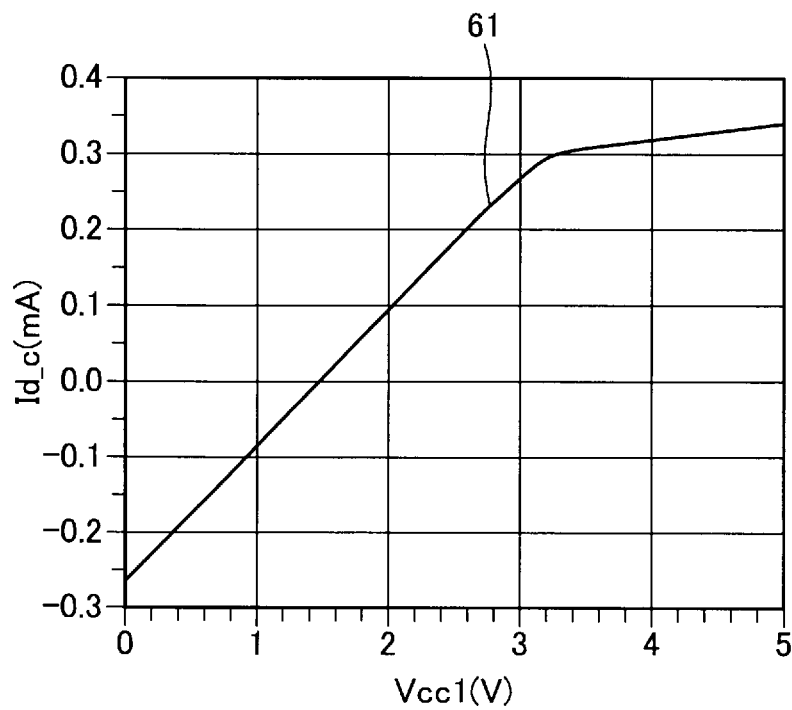
FIG. 6 illustrates circuit simulation results of the power amplifier circuit according to the first embodiment.

FIG. 6 illustrates a waveform 61 indicating a relationship between the power supply potential Vcc1 and the current Id_c. In FIG. 6, the horizontal axis represents the power supply potential Vcc1, and the vertical axis represents the current Id_c.

Figure 7:
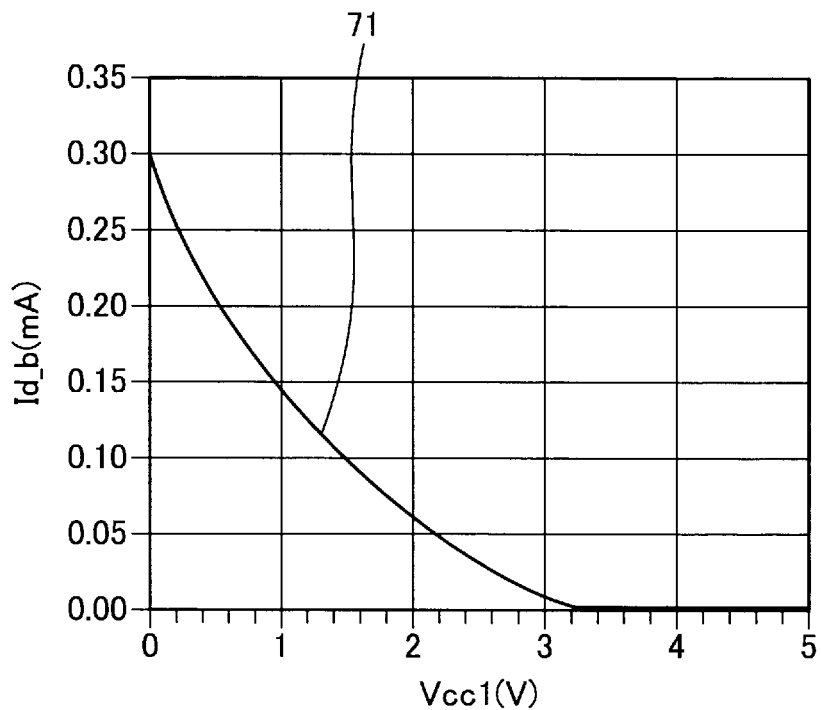
FIG. 7 illustrates circuit simulation results of the power amplifier circuit according to the first embodiment.

FIG. 7 illustrates a waveform 71 indicating a relationship between the power supply potential Vcc1 and the current Id_b. In FIG. 7, the horizontal axis represents the power supply potential Vcc1, and the vertical axis represents the current Id_b.

Figure 8:
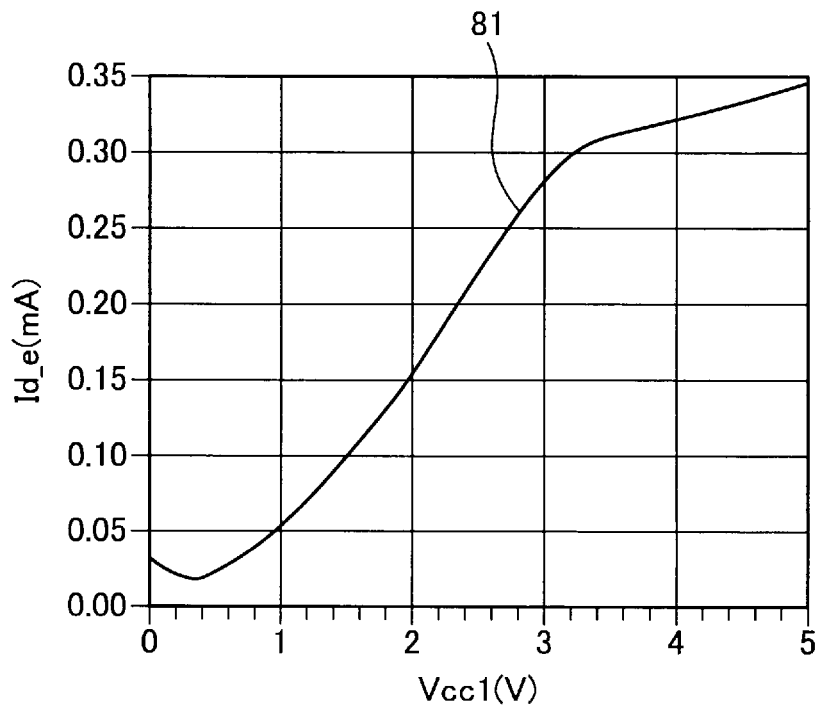
FIG. 8 illustrates circuit simulation results of the power amplifier circuit according to the first embodiment.

FIG. 8 illustrates a waveform 81 indicating a relationship between the power supply potential Vcc1 and the current Id_e. In FIG. 8, the horizontal axis represents the power supply potential Vcc1, and the vertical axis represents the current Id_e.

FIGS. 3 to 8 illustrate results of a circuit simulation performed when the range over which the power supply potential Vcc1 is changed is set to 0 V to 5 V. However, the present disclosure is not limited to this. The range over which the power supply potential Vcc1 is actually changed is not limited to the range in the simulation.

In the present disclosure, the lower-limit potential of the power supply potential Vcc1 is referred to as "first potential". The upper-limit potential of the power supply potential Vcc1 is referred to as "second potential". The first potential is, for example but not limitation, about 1.0 V. The second potential is, for example but not limitation, about 4.5 V.

The transistor Qd is a heterojunction bipolar transistor. Accordingly, the transistor Qd shows different behaviors before and after a third potential (threshold potential) for the power supply potential Vcc1 that is higher than the first potential and lower than the second potential. The third potential is, for example but not limitation, about 3 V.

The transistor Qd operates as an emitter follower circuit while the power supply potential Vcc1 is higher than the third potential and less than or equal to the second potential. On the other hand, the transistor Qd operates as two P-N junction diodes (the base-collector P-N junction and the base-emitter P-N junction) while the power supply potential Vcc1 is higher than or equal to the first potential and less than or equal to the third potential.

In the present disclosure, a path along which a current flows from the bias circuit 14 to the base of the transistor Q2 via the resistor Rb2 is referred to as "first current path". The emitter of the transistor 14e is electrically connected to the base of the transistor Q2 via the first current path. The emitter of the transistor Qd is electrically connected to the first current path via the resistor Rd_e.

A path along which a current flows from the bias circuit 14 to the node 11a via the resistor Rd_b, the P-N junction between the base and collector of the transistor Qd, and the resistor Rd_c is referred to as "second current path". The base of the transistor 14e is connected to the second current path via the resistor Rd_b.

A path along which a current flows from the node 11a to the base of the transistor Q2 via the resistor Rd_c, the collector and emitter of the transistor Qd, the resistor Rd_e, and the resistor Rb2 is referred to as "third current path".

Case where Transistor Operates as Emitter Follower Circuit

A case where the transistor Qd operates as an emitter follower circuit will be described. In this case, the current Ief_pwr flows from the bias circuit 14 to the base of the transistor Q2 via the first current path. Additionally, the current Id_e flows from the node 11a to the base of the transistor Q2 via the third current path. At this time, since the current Id_b is as small as negligible (see the waveform 71 illustrated in FIG. 7), the current Id_e is approximately equal to the current Id_c. That is, Id_e≈Id_c is satisfied.

Case where Transistor Operates as Two P-N Junction Diodes

A case where the transistor Qd operates as two P-N junction diodes will be described. In this case, a current flows from the bias circuit 14 to the node 11a via the second current path. This is because the turn-on voltage across the base-collector P-N junction of the transistor Qd is lower than the turn-on voltage across the base-emitter P-N junction of the transistor Qd, and thus a current can flow between the base and collector of the transistor Qd. At this time, the direction in which the current Id_c flows is opposite to the direction illustrated in FIG. 2.

The adjustment circuit 15 increases the current Id_c in the direction of flowing from the bias circuit 14 to the node 11a (opposite direction) via the second current path as the power supply potential Vcc1 decreases. In other words, the adjustment circuit 15 decreases the current Id_c in the direction toward the collector of the transistor Qd from the node 11a (forward direction) as the power supply potential Vcc1 decreases (see the waveform 61 illustrated in FIG. 6). That is, the adjustment circuit 15 decreases the current Id_e as the power supply potential Vcc1 decreases (see the waveform 81 illustrated in FIG. 8). Since the current Id_e decreases although the current Ief_pwr does not substantially change (see the waveform 41 illustrated in FIG. 4), the bias current Ib2 also decreases (see the waveform 42 illustrated in FIG. 4). Setting the resistance value of the resistor Rd_c to an appropriate value can adjust the bias current Ib2 so that the bias current Ib2 is not excessively decreased.

Accordingly, the collector current Icc2 of the transistor Q2 also decreases (see the waveform 51 illustrated in FIG. 5). As a result, the adjustment circuit 15 can decrease the gain of the transistor Q2 when the power supply potential Vcc1 is in the range greater than or equal to the first potential and less than or equal to the third potential. For example, the adjustment circuit 15 can decrease the gain of the transistor Q2 when the power supply potential Vcc1 is equal to the first potential, which is the lower-limit potential, compared with the gain obtained when efficiency is maximum during the maximum output of the transistor Q2.

Accordingly, the adjustment circuit 15 can improve the gain dispersion characteristic of the power amplifier 12.

Comparison with Comparative Example

Figure 9:
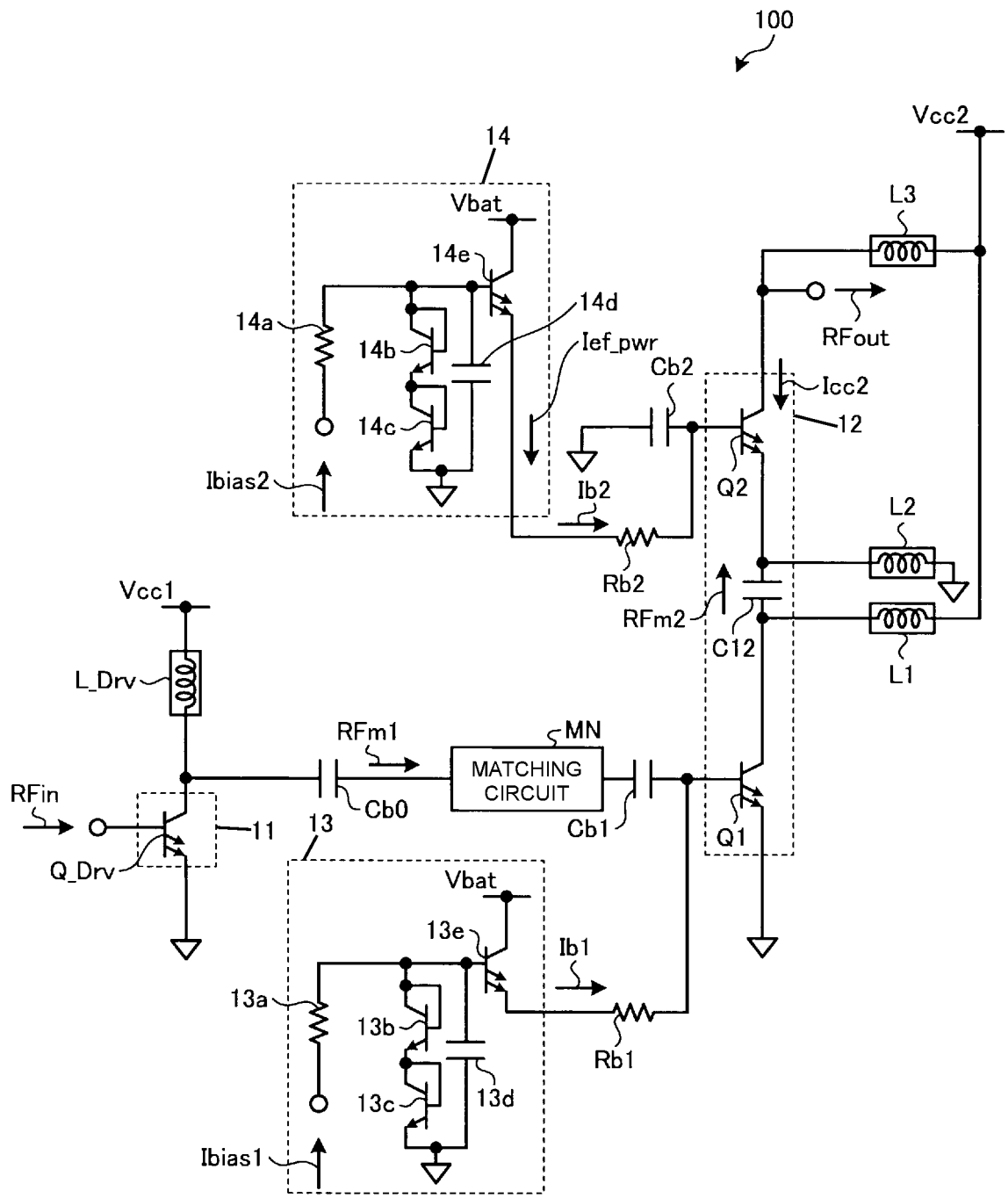
FIG. 9 illustrates a circuit configuration of a power amplifier circuit of a comparative example.

FIG. 9 illustrates a circuit configuration of a power amplifier circuit 100 of a comparative example. The power amplifier circuit 100 of the comparative example is the same as the power amplifier circuit 5 of the first embodiment, except that the power amplifier circuit 100 does not include the adjustment circuit 15.

In FIG. 4, the waveform 42 (the power amplifier circuit 5 of the first embodiment) and the waveform 43 (the power amplifier circuit 100 of the comparative example) are compared. Due to the operation of the adjustment circuit 15, when the power supply potential Vcc1 is about the first potential, the bias current Ib2 of the power amplifier circuit 5 is decreased, compared with the bias current Ib2 of the power amplifier circuit 100. When the power supply potential Vcc1 is about the second potential, the bias current Ib2 of the power amplifier circuit 5 is close to the bias current Ib2 of the power amplifier circuit 100.

This indicates that the adjustment circuit 15 can decrease the bias current Ib2 to the level required for the improvement of the gain dispersion characteristic.

As described above, accordingly, the transistor Qd operates as two P-N junction diodes when the power supply potential Vcc1 is in the range greater than or equal to the first potential and less than or equal to the third potential. In particular, in a heterojunction bipolar transistor used as the transistor Qd, the turn-on voltage across the base-collector P-N junction is different from the turn-on voltage across the base-emitter P-N junction. With the use of this characteristic, when the transistor Qd operates as two P-N junction diodes, the adjustment circuit 15 can cause the current Id_c to flow in the direction from the bias circuit 14 to the node 11a (opposite direction) via the second current path. As the current Id_c flowing in the direction from the bias circuit 14 to the node 11a (opposite direction) via the second current path increases, the adjustment circuit 15 can more largely decrease the current Id_e flowing from the adjustment circuit 15 to the base of the transistor Q2.

Accordingly, when the power supply potential Vcc1 is in the range greater than or equal to the first potential and less than or equal to the third potential, the adjustment circuit 15 can decrease the bias current Ib2 flowing through the base of the transistor Q2, reducing the gain of the transistor Q2. That is, the power amplifier circuit 5 can improve the gain dispersion characteristic. Accordingly, the power amplifier circuit 5 can reduce the distortion of reduce the distortion of the RF output signal RFout.

Modification

The first embodiment provides an example in which the adjustment circuit 15 is electrically connected to the bias circuit 14 and the transistor Q2. That is, the first embodiment provides an example in which the adjustment circuit 15 adjusts the bias current Ib2 to be input to the base of the transistor Q2 to reduce the gain of the transistor Q2. However, the adjustment circuit 15 may be electrically connected to the bias circuit 13 and the transistor Q1. That is, the adjustment circuit 15 may adjust the bias current Ib1 to be input to the base of the transistor Q1 to reduce the gain of the transistor Q1.

As in the first embodiment, the adjustment circuit 15 can be electrically connected to the bias circuit 14 and the transistor Q2. The reason for this is as follows.

The power supply potential Vcc1 is decreased and the gain of the power amplifier 12 is reduced when the RF input signal RFin has a small amplitude. When the RF input signal RFin has a small amplitude, a reduction of the gain of the transistor Q1 suppresses the amplitude of the signal component of the RF signal RFm2, thereby reducing the signal to noise (S/N) ratio of the RF signal RFm2. Since the transistor Q2 amplifies the RF signal RFm2 whose S/N ratio is reduced, the S/N ratio of the RF output signal RFout is reduced.

In the first embodiment, in contrast, even if the RF input signal RFin has a small amplitude, the gain of the transistor Q1 is not reduced. As a result, the amplitude of the signal component of the RF signal RFm2 is not suppressed. That is, a reduction in the S/N ratio of the RF signal RFm2 is suppressed. Since the transistor Q2 amplifies the RF signal RFm2 with the suppressed reduction in S/N ratio, a reduction in the S/N ratio of the RF output signal RFout is suppressed.

Therefore, as in the first embodiment, the adjustment circuit 15 can be electrically connected to the bias circuit 14 and the transistor Q2 since a reduction in the S/N ratio of the RF output signal RFout is suppressed.

Second Embodiment

Figure 10:
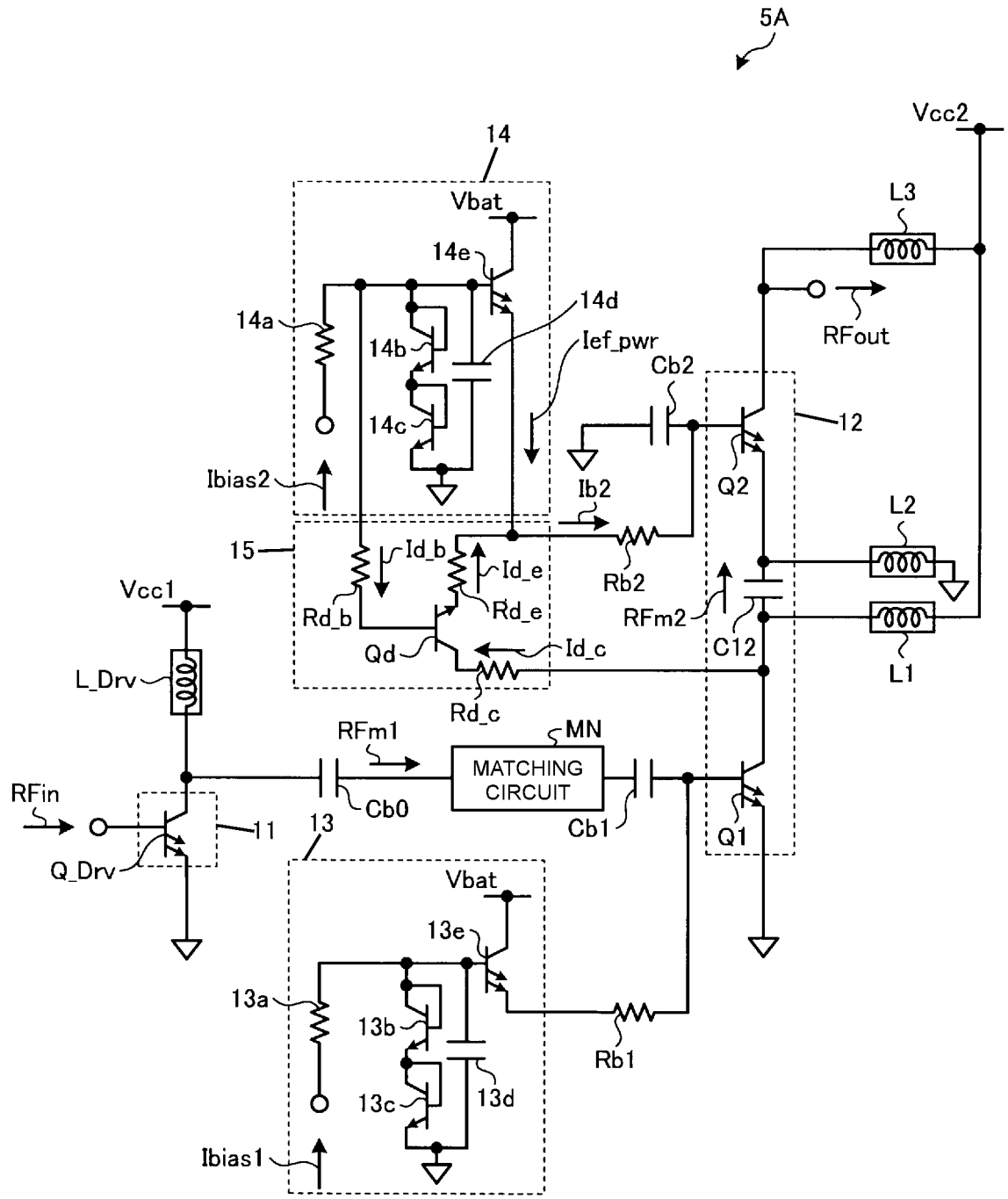
FIG. 10 illustrates a circuit configuration of a power amplifier circuit according to a second embodiment.

FIG. 10 illustrates a circuit configuration of a power amplifier circuit 5A according to a second embodiment. The power amplifier circuit 5A according to the second embodiment is the same as the power amplifier circuit 5 according to the first embodiment, except that the first end of the resistor Rd_c is electrically connected to the first end of the inductor L1.

The power supply potential Vcc2, which is an envelope-tracking power supply potential, is input to the first end of the resistor Rd_c. Accordingly, the operation of the adjustment circuit 15 is similar to that in the first embodiment. The adjustment circuit 15 outputs the current Id_e corresponding to the power supply potential Vcc2 to the base of the transistor Q2 via the resistors Rd_e and Rb2, thereby adjusting the bias current Ib2. That is, the power amplifier circuit 5A achieves advantages similar to those of the power amplifier circuit 5.

In addition, the power amplifier circuit 5A can enhance design flexibility. That is, the power amplifier circuit 5A can reduce the distortion of the RF output signal RFout even if the power supply potential Vcc1 is not a potential corresponding to the envelope of the RF input signal RFin. For example, the power amplifier circuit 5A can reduce the distortion of the RF output signal RFout even if the power supply potential Vcc1 is kept at a constant potential.

Modification

The second embodiment provides an example in which the first end of the resistor Rd_c is electrically connected to the first end of the inductor L1. Alternatively, the first end of the resistor Rd_c may be electrically connected to the first end of the inductor L3.

As in the second embodiment, the first end of the resistor Rd_c can be electrically connected to the first end of the inductor L1. The reason for this is as follows.

If the first end of the resistor Rd_c is electrically connected to the first end of the inductor L3 (the collector of the transistor Q2), a feedback path extending through the collector of the transistor Q2, the resistor Rd_c, the collector of the transistor Qd, the emitter of the transistor Qd, the resistor Rd_e, the resistor Rb2, the base of the transistor Q2, and the collector of the transistor Q2 in this order is generated, and oscillation may occur.

In contrast, as in the second embodiment, when the first end of the resistor Rd_c is electrically connected to the first end of the inductor L1, the feedback path described above is not generated, and the occurrence of oscillation is prevented or reduced.

Therefore, as in the second embodiment, the first end of the resistor Rd_c can be electrically connected to the first end of the inductor L1 since the occurrence of oscillation is prevented or reduced.

Third Embodiment

Figure 11:
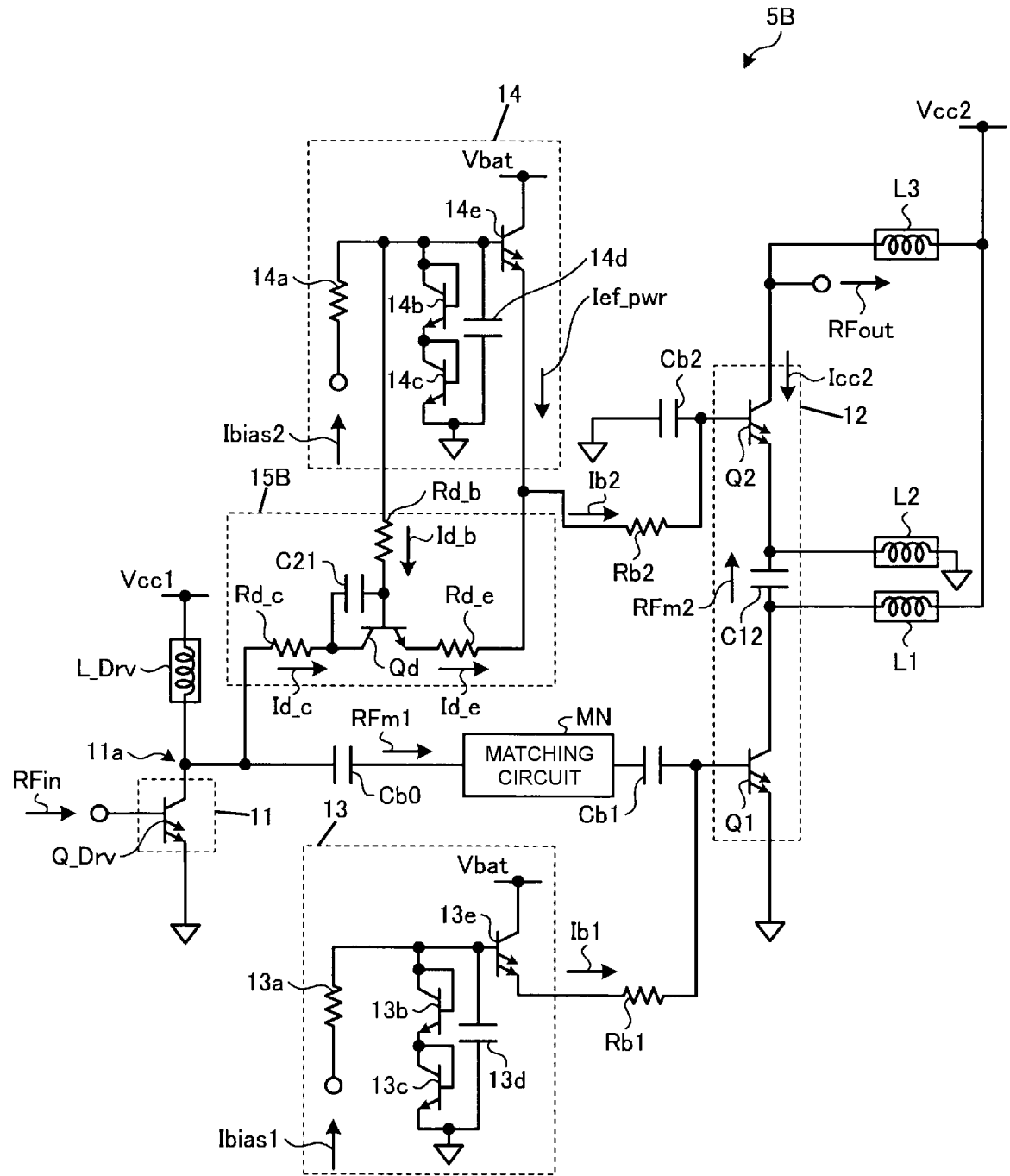
FIG. 11 illustrates a circuit configuration of a power amplifier circuit according to a third embodiment.

FIG. 11 illustrates a circuit configuration of a power amplifier circuit 5B according to a third embodiment. The power amplifier circuit 5B according to the third embodiment is the same as the power amplifier circuit 5 according to the first embodiment, except that an adjustment circuit 15B further includes a capacitor C21 in addition to the circuit configuration of the adjustment circuit 15. The capacitor C21 corresponds to a "second capacitor" of the present disclosure.

A first end of the capacitor C21 is electrically connected to the base of the transistor Qd. A second end of the capacitor C21 is electrically connected to the collector of the transistor Qd.

When the power supply potential Vcc1 is an envelope-tracking potential that changes in accordance with the envelope of the RF input signal RFin, a change in the power supply potential Vcc1 is propagated from the second end of the resistor Rd_c (the collector of the transistor Qd) to the base of the transistor Qd via the capacitor C21. Accordingly, the power amplifier circuit 5B can prevent or reduce a phase delay in the base potential of the transistor Qd.

Fourth Embodiment

Figure 12:
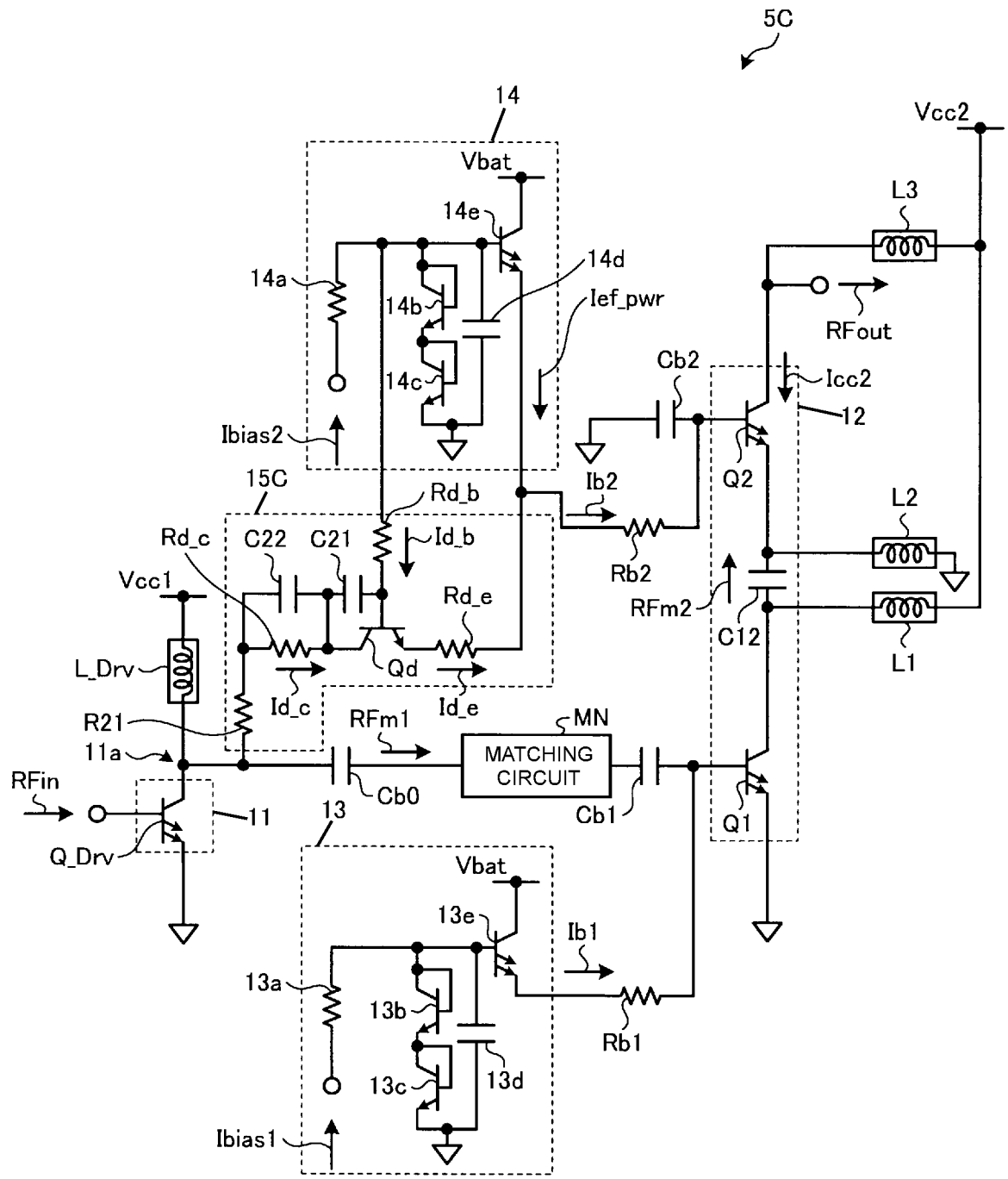
FIG. 12 illustrates a circuit configuration of a power amplifier circuit according to a fourth embodiment.

FIG. 12 illustrates a circuit configuration of a power amplifier circuit 5C according to a fourth embodiment. The power amplifier circuit 5C according to the fourth embodiment is the same as the power amplifier circuit 5B according to the third embodiment, except that an adjustment circuit 15C includes a capacitor C22 and a resistor R21 in addition of the circuit configuration of the adjustment circuit 15B. The capacitor C22 corresponds to a "third capacitor" of the present disclosure. The resistor R21 corresponds to a "fifth resistor" of the present disclosure.

The capacitor C22 is electrically connected in parallel to the resistor Rd_c. The resistor R21 is electrically connected between the resistor Rd_c and the node 11a.

The power amplifier circuit 5C guides an RF signal output from the collector of the transistor Q_Drv to the third current path described above to improve the amplitude versus phase characteristic (amplitude modulation to phase modulation (AM-PM) characteristic).

The fourth embodiment may be combined with the second embodiment. That is, a first end of the resistor R21 may be electrically connected to the first end of the inductor L1.

Fifth Embodiment

Figure 13:
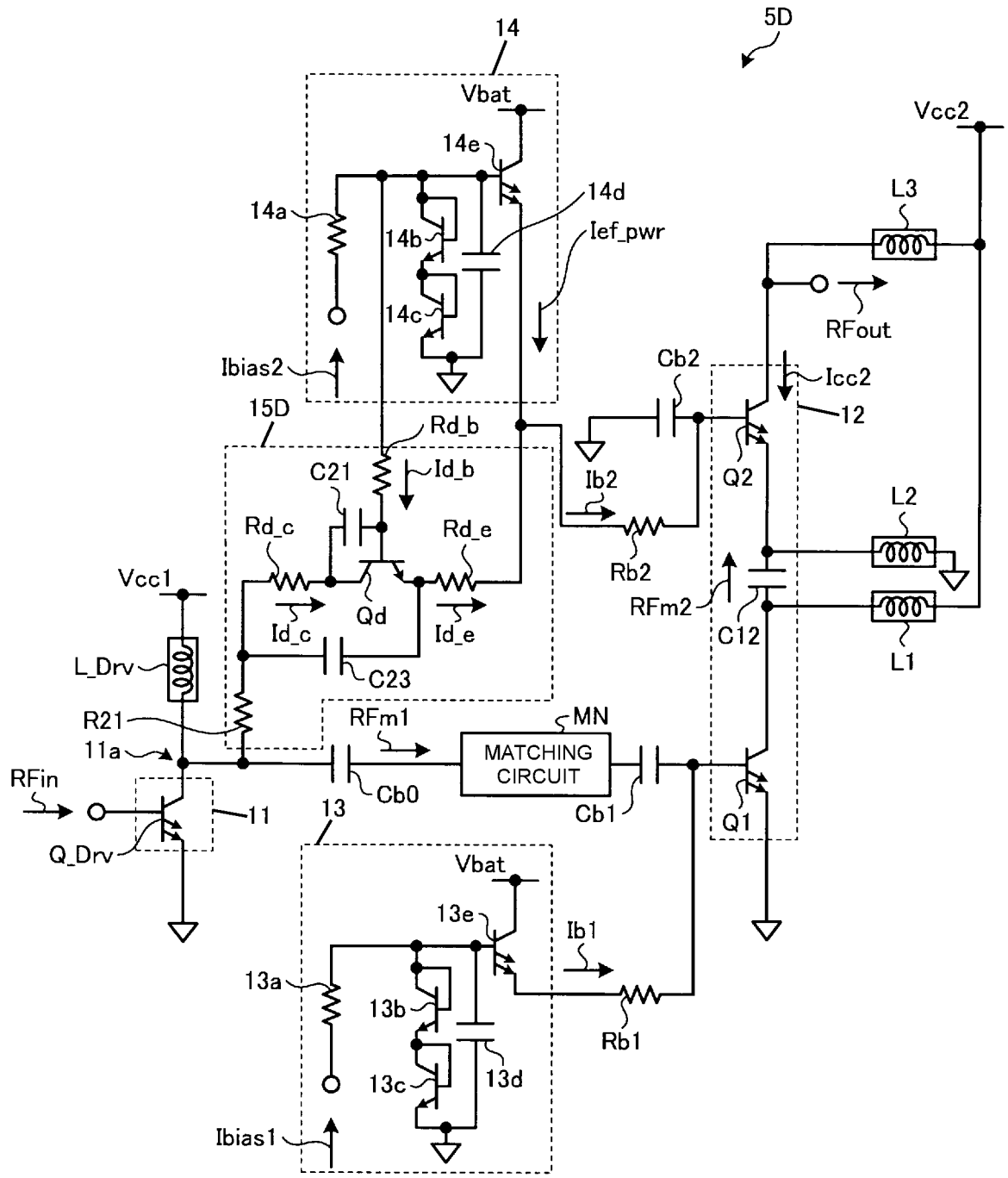
FIG. 13 illustrates a circuit configuration of a power amplifier circuit according to a fifth embodiment.

FIG. 13 illustrates a circuit configuration of a power amplifier circuit 5D according to a fifth embodiment. The power amplifier circuit 5D according to the fifth embodiment is the same as the power amplifier circuit 5C according to the fourth embodiment, except that an adjustment circuit 15D includes a capacitor C23 in place of the capacitor C22. The capacitor C23 corresponds to a "third capacitor" of the present disclosure.

A first end of the capacitor C23 is electrically connected to the first end of the resistor Rd_c. A second end of the capacitor C23 is electrically connected to the emitter of the transistor Qd.

The power amplifier circuit 5D guides an RF signal output from the transistor Q_Drv to the third current path described above to improve the amplitude versus phase characteristic (AM-PM characteristic).

The fifth embodiment may be combined with the second embodiment. That is, a first end of the resistor R21 may be electrically connected to the first end of the inductor L1.

The embodiments described above are intended to facilitate understanding of the present disclosure and are not to be construed as limiting the present disclosure. The present disclosure may be modified or improved without necessarily departing from the spirit thereof, and the present disclosure also includes equivalents thereof.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
    a first bias circuit configured to output a first current;
    a second bias circuit configured to output a second current;
    a power amplifier comprising:
        a first transistor having a first terminal electrically connected to a reference potential, a second terminal to which the first current is input via a first resistor and to which a radio-frequency signal is input via a first direct-current cut capacitor, and a third terminal electrically connected to a first power supply potential that changes in accordance with an envelope of the radio-frequency signal via a first inductor,
        a capacitor having a first end electrically connected to the third terminal of the first transistor, and a second end, and
        a second transistor having a first terminal electrically connected to the second end of the capacitor and electrically connected to the reference potential via a second inductor, a second terminal to which the second current is input via a second resistor and which is electrically connected to the reference potential via a second direct-current cut capacitor, and a third terminal electrically connected to the first power supply potential via a third inductor, the second transistor being configured to output a radio-frequency output signal from the third terminal of the second transistor, the radio-frequency output signal being obtained by amplifying the radio-frequency signal; and
    an adjustment circuit configured to output a third current corresponding to the first power supply potential or corresponding to a second power supply potential that changes in accordance with the envelope, to the second terminal of the second transistor via the second resistor.

2. The power amplifier circuit according to claim 1, wherein the adjustment circuit comprises:
    a third transistor having a first terminal, a second terminal to which a constant potential is input via a third resistor, and a third terminal electrically connected to the first power supply potential or the second power supply potential via a fourth resistor, the third transistor being configured to output the third current from the first terminal of the third transistor.

3. The power amplifier circuit according to claim 2, further comprising a second power amplifier,
    wherein the second power amplifier comprises a fourth transistor having a first terminal electrically connected to the reference potential, a second terminal to which a radio-frequency input signal is input, and a third terminal electrically connected to the second power supply potential via a fourth inductor, the fourth transistor being configured to output the radio-frequency signal from the third terminal of the fourth transistor, the radio-frequency signal being obtained by amplifying the radio-frequency input signal, and
    wherein the third terminal of the third transistor is electrically connected to a node between the third terminal of the fourth transistor and the fourth inductor via the fourth resistor.

4. The power amplifier circuit according to claim 2, wherein the third terminal of the third transistor is electrically connected to a node between the third terminal of the first transistor and the first inductor via the fourth resistor.

5. The power amplifier circuit according to claim 2, wherein the adjustment circuit further comprises:
    a second capacitor having a first end electrically connected to the third terminal of the third transistor, and a second end electrically connected to the second terminal of the third transistor.

6. The power amplifier circuit according to claim 5, wherein the adjustment circuit further comprises:

a third capacitor electrically connected in parallel to the fourth resistor, and a fifth resistor electrically connected between the first power supply potential or the second power supply potential, and the fourth resistor.

7. The power amplifier circuit according to claim 5, wherein the adjustment circuit further comprises:

a fifth resistor electrically connected between the first power supply potential or the second power supply potential, and the fourth resistor, and a third capacitor having a first end electrically connected to a node between the fourth resistor and the fifth resistor, and a second end electrically connected to the first terminal of the third transistor.

* * * * *